US011539357B2

(12) United States Patent
Mayer et al.

(10) Patent No.: US 11,539,357 B2
(45) Date of Patent: Dec. 27, 2022

(54) SMART ELECTRONIC SWITCH

(71) Applicant: Infineon Technologies AG, Neubiberg (DE)

(72) Inventors: Alexander Mayer, Treffen (AT); Robert Illing, Finkenstein (AT); Marco Faricelli, Villach (AT)

(73) Assignee: Infineon Technologies AG, Neubiberg (DE)

( * ) Notice: Subject to any disclaimer, the term of this patent is extended or adjusted under 35 U.S.C. 154(b) by 364 days.

(21) Appl. No.: 16/922,984

(22) Filed: Jul. 7, 2020

(65) Prior Publication Data

US 2021/0028781 A1 Jan. 28, 2021

(30) Foreign Application Priority Data

Jul. 24, 2019 (DE) .......................... 102019119975.1

(51) Int. Cl.
*H03K 17/0814* (2006.01)
*H02H 3/08* (2006.01)
(Continued)

(52) U.S. Cl.
CPC ......... *H03K 17/08142* (2013.01); *H02H 3/08* (2013.01); *H03K 17/0828* (2013.01);
(Continued)

(58) Field of Classification Search
CPC ......... H03K 17/08142; H03K 17/0828; H03K 2017/0806; H03K 2017/6875; H02H 3/08
See application file for complete search history.

(56) References Cited

U.S. PATENT DOCUMENTS 4,245,318 A * 1/1981 Eckart .................. H02H 7/30
                                                      703/4
4,939,347 A * 7/1990 Masaka ............... F02P 19/022
                                                     219/205
(Continued)

FOREIGN PATENT DOCUMENTS

DE   102004063946 A1   3/2006
DE   102016100498 A1   7/2016
(Continued)

OTHER PUBLICATIONS

Oppenheim et al., Chapter 6, Section 6.3 Basic Structures for HR Systems, Discrete-Time Signal Processing, 2nd Edition, 1999, pp. 359-361. (Applicant points out, in accordance with MPEP 609. 94(a), that the year of publication, 1999, is sufficiently earlier than the effective U.S. filing date, so that the particular month of publication is not in issue.).
(Continued)

*Primary Examiner* — Scott Bauer
(74) *Attorney, Agent, or Firm* — Shumaker & Sieffert, P.A.

(57) ABSTRACT

An integrated circuit may include a power transistor coupled between a supply pin and an output pin; a current sensing circuit configured to sense a load current passing through the power transistor and to provide a respective current sense signal; a first configuration pin; a current output circuit configured to provide a diagnosis current at a current output pin; a diagnosis pin for receiving a diagnosis request signal; and a control circuit configured to: select a characteristic curve representing a current versus time characteristic dependent on a external circuit connected to the first configuration pin; generate a drive signal for the power transistor dependent on the selected characteristic curve and the current sense signal; and control—dependent on a pulse pattern of the diagnosis request signal—the current output
(Continued)

circuit to set the value of the diagnosis current such that it represents the load current or the selected characteristic curve.

10 Claims, 8 Drawing Sheets

(51) Int. Cl.
   *H03K 17/082* (2006.01)
   *H03K 17/687* (2006.01)
   *H03K 17/08* (2006.01)

(52) U.S. Cl.
   CPC .............. *H03K 2017/0806* (2013.01); *H03K 2017/6875* (2013.01)

(56) References Cited

U.S. PATENT DOCUMENTS

| | | | |
|---|---|---|---|
| 6,054,845 A * | 4/2000 | Feldtkeller | G05F 3/267 |
| | | | 323/277 |
| 6,144,085 A | 11/2000 | Barker | |
| 6,400,163 B1 * | 6/2002 | Melcher | G01R 31/3277 |
| | | | 324/715 |
| 7,279,765 B2 | 10/2007 | Ahn et al. | |
| 7,489,855 B2 | 2/2009 | Kraus | |
| 9,413,352 B2 | 8/2016 | Lim | |
| 9,672,201 B1 | 6/2017 | Uszkoreit et al. | |
| 9,887,532 B2 | 2/2018 | Djelassi et al. | |
| 10,305,363 B1 | 5/2019 | Chen et al. | |
| 2002/0024376 A1 | 2/2002 | Sander | |
| 2005/0184715 A1 | 8/2005 | Kidokoro et al. | |
| 2005/0270869 A1 | 12/2005 | Krischke et al. | |
| 2007/0008744 A1 | 1/2007 | Heo et al. | |
| 2009/0261766 A1 * | 10/2009 | Lurk | H02P 29/026 |
| | | | 318/400.42 |
| 2011/0141643 A1 * | 6/2011 | Hummel | H02H 3/08 |
| | | | 361/93.1 |
| 2012/0194119 A1 | 8/2012 | Kroeze et al. | |
| 2013/0301175 A1 | 11/2013 | Posat | |
| 2014/0078629 A1 | 3/2014 | Cortigiani et al. | |
| 2014/0091384 A1 | 4/2014 | Petruzzi et al. | |
| 2017/0063077 A1 | 3/2017 | Donath et al. | |
| 2017/0294772 A1 | 10/2017 | Illing et al. | |
| 2017/0294918 A1 | 10/2017 | Illing et al. | |
| 2017/0294922 A1 | 10/2017 | Illing et al. | |
| 2017/0366116 A1 | 12/2017 | Ogawa et al. | |
| 2018/0287365 A1 | 10/2018 | Djelassi-Tscheck et al. | |
| 2020/0021207 A1 | 1/2020 | Donat et al. | |

FOREIGN PATENT DOCUMENTS

| | | |
|---|---|---|
| DE | 102015144460 A1 | 3/2017 |
| DE | 102017107520 A1 | 11/2017 |
| DE | 102017107523 A1 | 11/2017 |
| DE | 102017106896 A1 | 10/2018 |
| WO | 01/69784 A1 | 9/2001 |

OTHER PUBLICATIONS

Infineon Technologies AG, "BTN8962TA High Current PN Half Bridge NovalithIC™," Data Sheet, Rev 1.0, May 17, 2013, 26 pp.
International Standard ISO 7637-2, Third Edition, Mar. 1, 2011, entitled "Road vehicles—Electrical disturbances from conduction and coupling—Part 2: Electrical transient conduction along supply lines only," 48 pp.
International Standard ISO 26262-1, Second Edition, Dec. 2018, entitled "Road vehicles—Functional safety—Part 1: Vocabulary," 42 pp.
Office Action, in the German language, from counterpart German Application No. DE 10 2019 119 975.1, dated Apr. 1, 2020, 4 pp.

* cited by examiner

SMART ELECTRONIC SWITCH

This application claims priority to German Patent Application Number 102019119975.1, filed Jul. 24, 2019, the entire content of which is incorporated herein by reference.

TECHNICAL FIELD

The present disclosure relates to the field of smart semiconductor switches.

BACKGROUND

Almost every electric installation (e.g. in an automobile, in a house, electric subsystems of larger installations) includes one of more fuses to provide an over-current protection. Standard fuses include a piece of wire that provides a low-ohmic current path when the current passing through the fuse is below a nominal current. However, the piece of wire is designed to heat up and melt or vaporize when the current passing through the fuse exceeds the nominal current for a specific time. Once triggered a fuse has to be replaced by a new one.

Fuses are increasingly being replaced by circuit breakers. A circuit breaker is an automatically operated electrical switch designed to protect an electrical circuit from damage caused by overcurrent or overload or short-circuit. Circuit breakers may include electro-mechanical relays, which are triggered to disconnect the protected circuit from the supply when an over-current (i.e. a current exceeding the nominal current) is detected. In many applications (e.g. in the on-board power supply of an automobile), circuit breakers may be implemented using an electronic switch (e.g. a MOS transistor, an IGBT or the like) to disconnect the protected circuit from the supply in case of an over-current. Such electronic circuit breakers may also be referred to as electronic fuses (e-fuses or smart fuses). Besides its function as a circuit breaker, an electronic fuse may also be used to regularly switch a load on and off. Usually, the switching state (on/off) of electronic switches such as MOS transistors is controlled using so-called driver circuits or simply drivers (gate drivers in case of MOS transistors).

However, at least in some electronic circuit breakers (electronic fuses or e-fuses) common driver circuits may be inadequate with regard to fault tolerance and functional safety, which may be an issue particularly in automotive applications, in which standards concerning functional safety must be complied with (e.g. ISO 26262). In fact, an electronic fuse needs to be more than just a classical fuse replaced by an electronic switch. A robust implementation of an electronic fuse entails various challenges. Further, efficient configuration of the electronic fuse may be an issue.

SUMMARY

An integrated circuit is described herein. In accordance with one exemplary embodiment the integrated circuit includes a power transistor coupled between a supply pin and an output pin; a current sensing circuit configured to sense a load current passing through the power transistor and to provide a respective current sense signal; a first configuration pin; a current output circuit configured to provide a diagnosis current at a current output pin; a diagnosis pin for receiving a diagnosis request signal; and a control circuit configured to: select a characteristic curve representing a current versus time characteristic dependent on a external circuit connected to the first configuration pin; generate a drive signal for the power transistor dependent on the selected characteristic curve and the current sense signal; and control—dependent on a pulse pattern of the diagnosis request signal—the current output circuit to set the value of the diagnosis current such that it represents one of the following: the load current and the selected characteristic curve.

Furthermore a method is described herein which, in accordance with one exemplary embodiment, includes sensing a load current passing through a power transistor coupled between a supply pin and an output pin of an integrated circuit and providing a respective current sense signal; selecting a characteristic curve representing a current versus time characteristic dependent on an external circuit connected to a first configuration pin; generating a drive signal for the power transistor dependent on the selected characteristic curve and the current sense signal; receiving a diagnosis request signal at a diagnosis pin of the integrated circuit; and providing a diagnosis current at an current output pin of the integrated circuit. The diagnosis current is set, dependent on a pulse pattern of the diagnosis request signal, such that it represents one of the following: the load current and the selected characteristic curve.

BRIEF DESCRIPTION OF THE DRAWINGS

The invention can be better understood with reference to the following drawings and descriptions. The components in the figures are not necessarily to scale; instead emphasis is placed upon illustrating the principles of the invention. Moreover, in the figures, like reference numerals designate corresponding parts. In the drawings.

DETAILED DESCRIPTION

In the following detailed description, reference is made to the accompanying drawings. The drawings form a part of the description and, for the purpose of illustration, show examples of how the invention may be used and implemented. It is to be understood that the features of the various embodiments described herein may be combined with each other, unless specifically noted otherwise.

Figure 1:
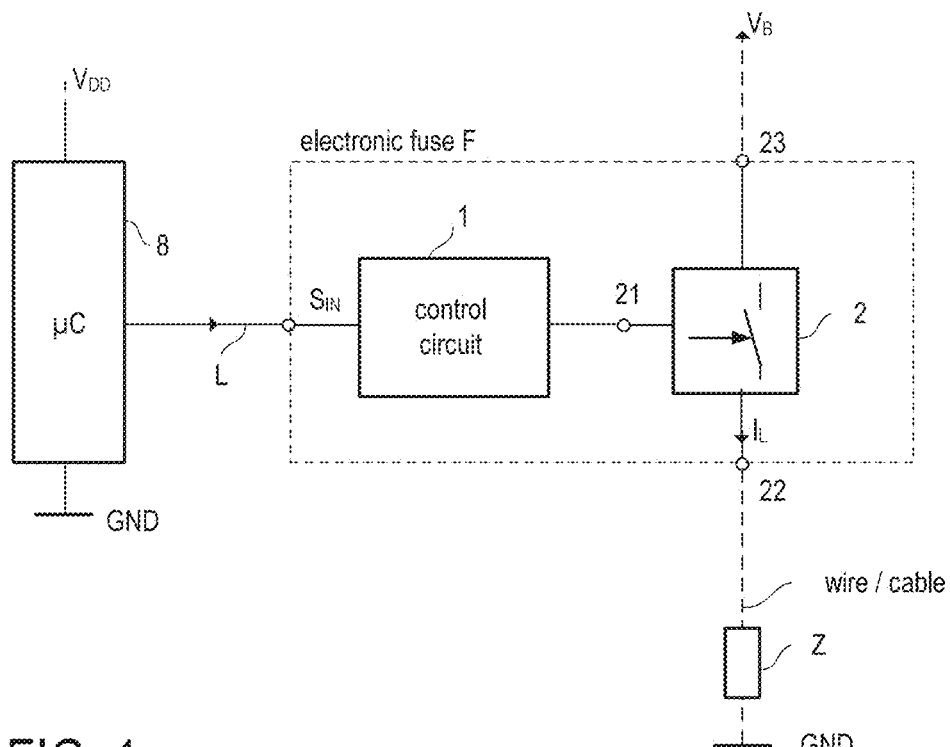
FIG. 1 schematically illustrates one example of an electronic fuse circuit including an electronic switch and a control circuit configured to drive the electronic switch and an exemplary application of the electronic fuse circuit.

FIG. 1 illustrates one example of an electronic circuit, which may be operated as an electronic fuse. Therefore, the electronic circuit is further referred to as electronic fuse circuit F. In accordance with the present example, an electronic fuse circuit includes an electronic switch 2 with a control node 21 and a load current path between a first load node 22 and a second load node 23. The electronic circuit further includes a control circuit 1 coupled to the control node 21 of the electronic switch 2 and configured to drive the electronic switch 2. The electronic fuse circuit F with electronic switch 2 and control circuit 1 may be monolithically integrated in one semiconductor die (chip) or may be integrated in two semiconductor dies that are arranged in one integrated circuit package. The electronic fuse circuit F is configured to drive a load Z (the wires connecting the load are illustrated in dashed lines in FIG. 1) that can be connected in series with the load current path of the electronic switch 2. Thus the series circuit of the load current path of the electronic switch 2 and load Z may be connected between supply nodes, at which a positive supply potential and a negative supply potential or ground potential GND (zero volts) may be provided. In the following, a voltage between the two supply nodes is referred to as supply voltage $V_B$. The load current $i_L$ passing through the load Z may be switched on and off in accordance with an input signal $S_{IN}$ supplied to the control circuit 1, for example, by a micro controller 8. However, dependent on the application, the input signal $S_{IN}$ may be generated by any other circuitry instead of a micro controller.

In an exemplary application, the electronic fuse circuit F may be used to drive a load Z in an automobile. In this case, a power source that supplies the supply voltage $V_B$ is an automobile battery. Generally, "to drive a load" may include switching on or off the load current passing through the load by switching on or off the electronic switch 2. The load may be an arbitrary load used in an automobile. Examples of the load Z include, inter alia, different types of lamps, different types of motors, relays, a heating system, or the like. In the example illustrated in FIG. 1, the electronic switch 2 and the load Z are connected in a high-side configuration. That is, the load Z is connected between the electronic switch 2 and the ground node GND. This, however, is only an example. The electronic switch 2 and the load Z may also be connected in a low-side configuration or in any other configuration as well. For example, in a low-side configuration the electronic switch is connected between the load Z and the ground node GND.

According to the example of FIG. 1, the load Z may be connected to the electronic switch 2 via an electrically conductive wire (e.g. included in a cable). Dependent on where the electronic circuit and the respective load Z are located within the electric installation of an automobile, the wire may have a considerable length of several 10 cm or even more (e.g. up to 10 m). A modern automobile includes a plurality of electric loads, so that a plurality of wires are required to connect the individual loads to their respective electronic switches. In order to save costs and resources, it may be desirable to dimension the individual wires such that, on a long term, they withstand a nominal current of the connected load. If, however, the current rises above the nominal current, the wire may be damaged or even destroyed due to overheating. According to one exemplary embodiment, the control circuit 1 may therefore have a current monitor function in order to monitor the load current $i_L$ passing through the electronic switch 2 (and the load Z). The current monitoring allows to switch off the electronic switch 2 in order to protect the wire (and the load Z) when an overload scenario is detected. An "overload scenario" is a scenario that may result in the wire or the load being damaged or destroyed if the electronic switch 2 is not switched off (within a specific time) to disconnect the wire (and the load Z) from the power source that provides the supply voltage $V_B$ (e.g. the automobile battery). This mechanism is explained in further detail herein below. As the electronic fuse circuit F is configured to switch on and off the load Z and to protect the wire, it is also referred to as a switching and protection circuit in the following.

According to the example of FIG. 1, the electronic switch 2 is schematically drawn as a circuit block that includes a switch. In the following, the term "electronic switch" includes any type of electronic switch or electronic circuitry that has a control node 21 and a load current path between the first load node 22 and the second load node 23 and that is configured to be switched on and off dependent on a drive signal received at the control node 21. "Switched on" means that the electronic switch 2 operates in an on-state, in which the electronic switch 2 is capable of conducting a current between the first load node 22 and the second load node 23. "Switched off" means that the electronic switch 2 is operated in an off-state, in which the electronic switch 2 is capable of preventing a current flow between the first load node 22 and the second load node 23. According to one example, the electronic switch 2 includes at least one transistor. The at least one transistor may be, for example, a MOSFET (Metal Oxide Semiconductor Field-Effect Transistor), an IGBT (Insulated Gate Bipolar Transistor), a JFET (Junction Field-Effect Transistor), a BJT (Bipolar Junction Transistor), or a HEMT (High Electron Mobility Transistor).

In the following, examples of the control circuit 1 and its function are explained with reference to the drawings. In particular, the function of the control circuit 1 is explained with reference to functional blocks depicted in the drawings. It should be noted that these functional blocks represent the function of the control circuit 1 rather than its specific implementation. These functional blocks may be dedicated circuit blocks configured to perform the respective function explained below. However, it may also be possible that the functions of the individual functional blocks are performed by a programmable circuit (processor) that is configured to execute software/firmware stored in a memory.

Figure 2:
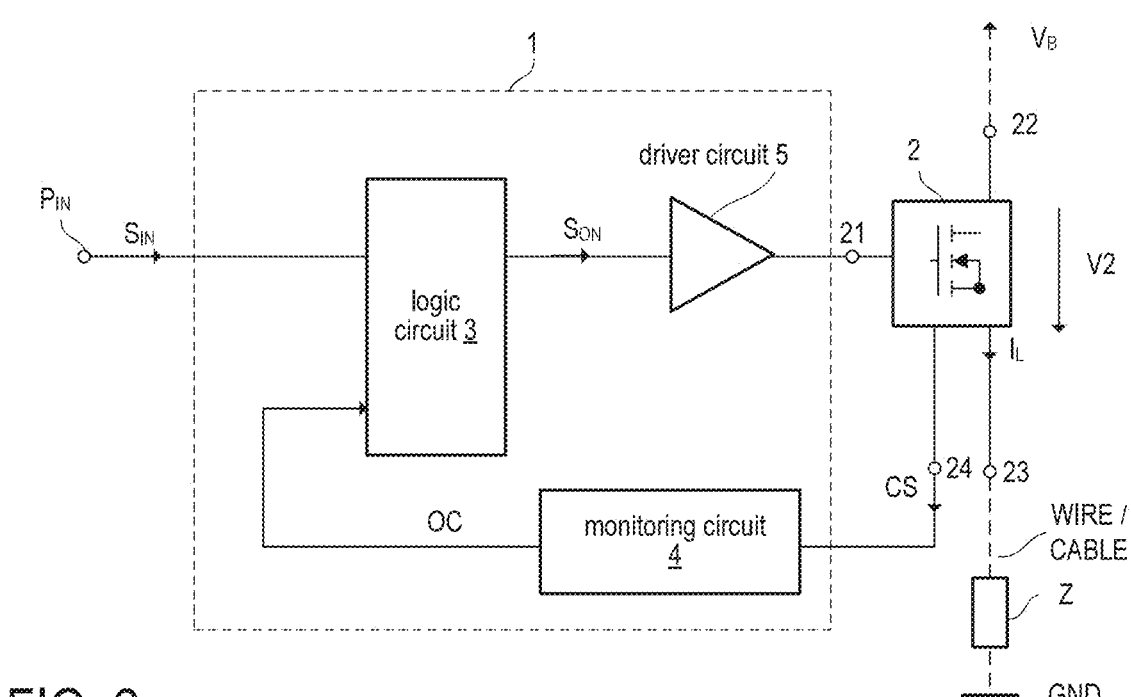
FIG. 2 illustrates one example of the control circuit of FIG. 1 in more detail.

FIG. 2 illustrates one exemplary implementation of the control circuit 1. In this example, the control circuit 1 includes a monitoring circuit 4 that is configured to generate a first protection signal OC based on a current-time-characteristic of the load current $i_L$. The expression "to generate the first protection signal OC based on the current-time-characteristic of the load current $i_L$" may include that the monitoring circuit 4 processes an instantaneous current amplitude of the load current $i_L$ as well as previous current amplitudes to generate the first protection signal OC. That is, the monitoring circuit 4 evaluates the load current $i_L$ over a certain time period in order to generate the first protection signal OC. To be able to evaluate the load current $i_L$ the monitoring circuit 4 receives a current sense signal CS and generates the first protection signal OC based on the current sense signal CS. The current sense signal CS represents the load current $i_L$ and, according to one example, may be proportional to the load current $i_L$. In the example of FIG. 2, the current sense signal CS is available at a sense output 24 of the electronic switch 2. In this case, a current measurement circuit configured to measure the load current $i_L$ and provide the current sense signal CS may be integrated in the electronic switch 2. However, this is only an example. A current measurement circuit separate from the electronic switch 2 may be used as well. Various current sense circuits (e.g. shunt resistors, Sense-FET circuits, etc.) are known and are thus not further explained herein in more detail. One specific example of a current sense circuit is included in FIG. 8 and will be discussed further below.

The control circuit 1 illustrated in FIG. 2 is configured to drive the electronic switch 2 based on the protection signal OC and an input signal $S_{IN}$ received at a first input node (e.g. input pin) $P_{IN}$ of the electronic fuse circuit F. The protection signal OC as well as the input signal $S_{IN}$ are supplied to a logic circuit 3, which generates a drive signal $S_{ON}$ based on the protection signal OC and the input signal $S_{IN}$. The drive signal $S_{ON}$ is directly or indirectly (e.g. via driver circuit 5) supplied to the control node 21 of the electronic switch 2 in order to switch the electronic switch 2 on or off. According to one example, the drive signal $S_{ON}$ may be a logic signal that has an on-level indicating that it is desired to switch the electronic switch 2 on or an off-level indicating that it is desired to switch the electronic switch 2 off. The driver circuit 5 (or simply driver) is configured to drive the electronic switch 2 based on the respective signal level of the drive signal $S_{ON}$. The electronic switch 2, for example, includes a transistor, such as a MOSFET (as schematically illustrated in FIG. 2). A MOSFET is a voltage controlled semiconductor device that switches on or off dependent on a drive voltage applied between a gate node and a source node. In this example, the driver 5 is configured to generate the drive voltage (gate voltage $V_G$) based on the drive signal $S_{ON}$ in order to switch on or off the MOSFET in accordance with the drive signal. When using MOSFETs, the driver 5 is also referred to as gate driver.

Figure 3:
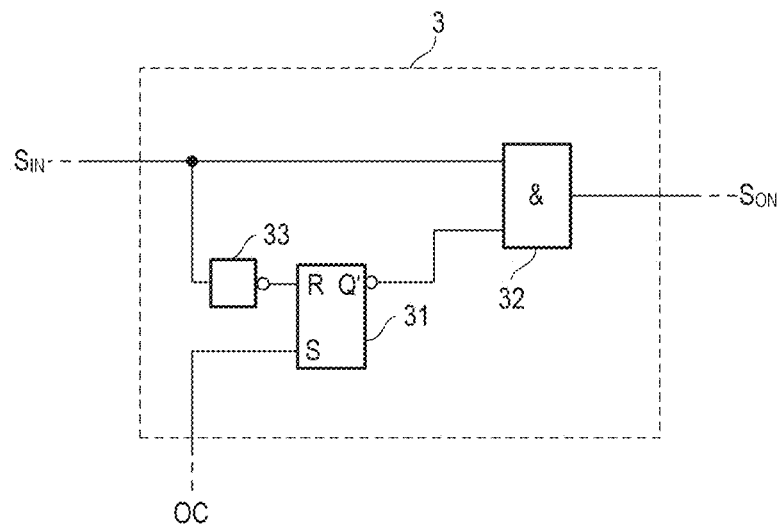
FIG. 3 illustrates one example of a logic circuit used in the control circuit of FIG. 2.

The circuit of FIG. 3 illustrates one exemplary implementation of (a part of) the logic circuit 3. In the present example, the logic circuit 3 includes an inverter 33, an SR latch 31 (flip-flop) and an AND gate 32. A first input of the AND gate 32 is configured to receive the input signal $S_{IN}$, whereas a reset input R of the SR latch 31 is configured to receive the inverted input signal provided by inverter 33. The set input S of the SR latch 31 is configured to receive the first protection signal OC. The inverting output Q' of the SR latch 31 is connected with a second input of the AND gate 32. The drive signal $S_{ON}$ is provided at the output of the AND gate 32.

Figure 4:
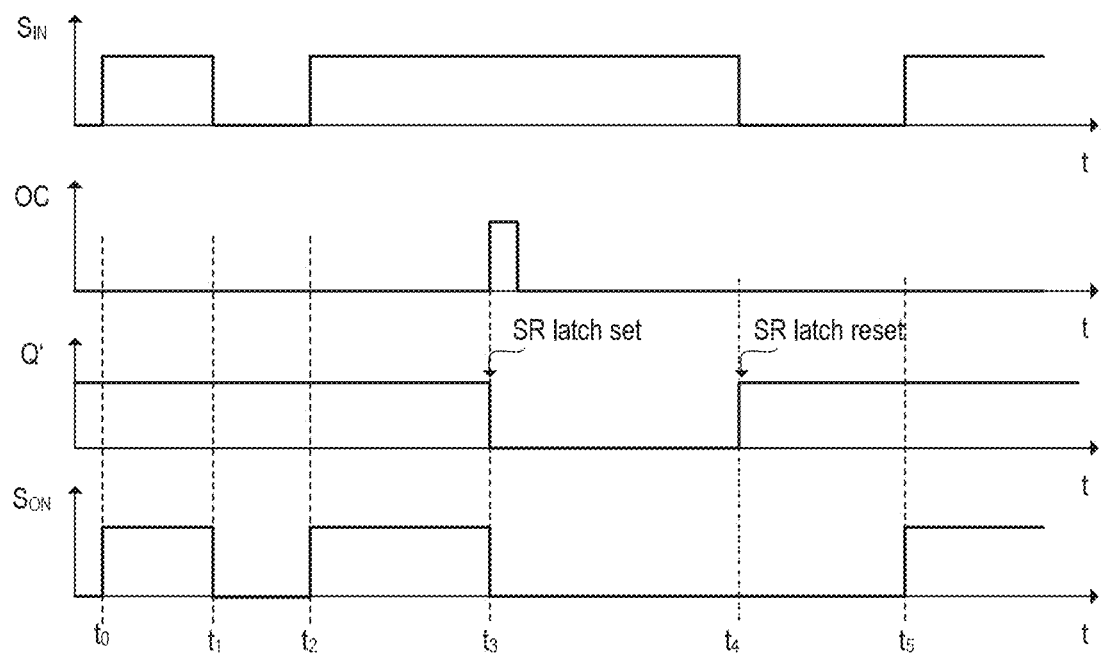
FIG. 4 includes timing diagrams illustrating the function of the control circuit shown in FIG. 2.

The function of the logic circuit 3 is further illustrated by the timing diagrams of FIG. 4. The initial low level of input signal $S_{IN}$ causes a reset of the SR latch 31, which results in a high level at the inverting output Q' of the SR latch 31. Accordingly, both inputs of the AND gate 32 "see" a high level, and thus the output of the AND gate 32 provides the drive signal $S_{ON}$ with a high-level. When the input signal $S_{IN}$ changes to a low level (indicating a switch-off of the electronic switch 2, see FIG. 4, time instant $t_1$ and $t_2$), the AND gate 32 "sees" a low level at its first input, and thus the output of the AND gate 32 provides the drive signal $S_{ON}$ with a low-level. In other words, the input signal $S_{IN}$ is fed through the logic circuit 3 (i.e. the drive signal $S_{ON}$ equals the input signal $S_{IN}$) provided that the SR latch 31 is in its reset state. Once the SR latch 31 is set by the first protection signal OC changing to a high-level, the inverting output Q' of the SR latch 31 is set to a low level (see FIG. 4, time instant $t_3$). Accordingly, the AND gate 32 sees a low level at its second input and thus the drive signal $S_{ON}$ is set to a low level. In other words, the input signal $S_{IN}$ is blanked by the AND gate 32. The drive signal $S_{ON}$ remains at a low-level until the input signal $S_{IN}$ is set to a low level (indicating a switch-off of the electronic switch 2 and a reset of SR latch 31, see FIG. 4, time instant $t_4$) and again to a high level (indicating a switch-on of the electronic switch 2, see FIG. 4, time instant $t_5$). It is again noted that the function of the exemplary implementation of FIG. 3 may be implemented in various other ways.

Figure 5A:
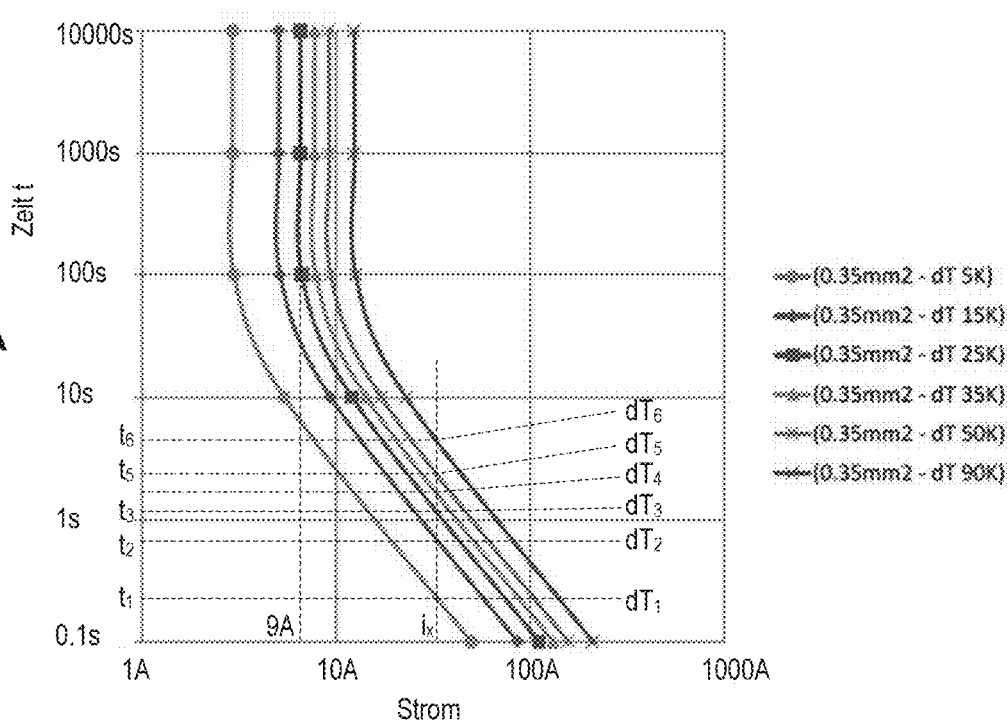
FIG. 5A is a diagram illustrating a family of characteristic curves (time over current) for a 0.35 $mm^2$ cable and for different maximum cable temperatures.
Figure 5B:
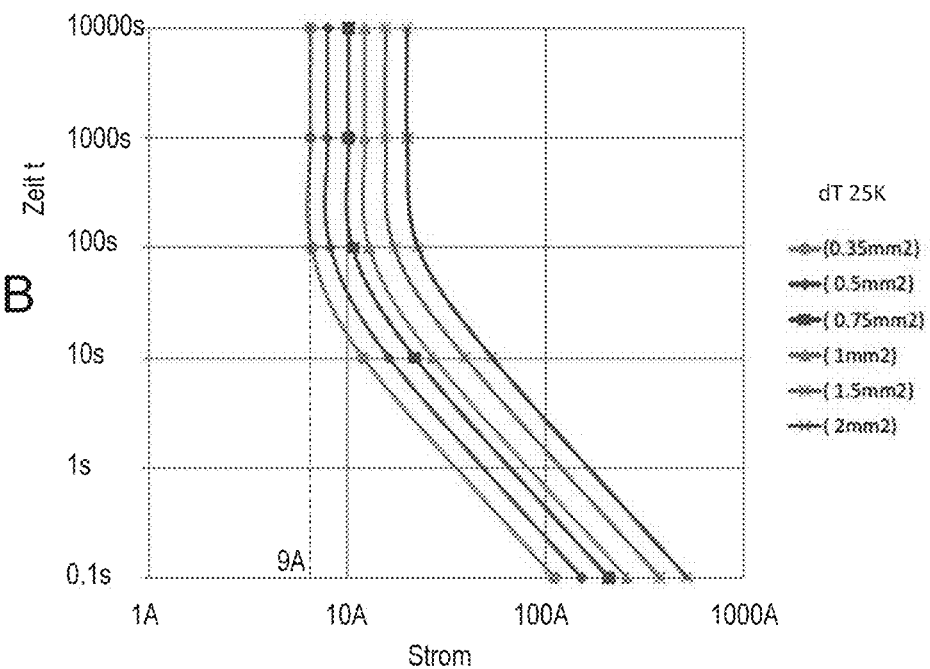
FIG. 5B is a diagram illustrating a family of characteristic curves (time over current) for a maximum cable temperature of 25 Kelvin above ambient temperature and for different cable cross-sections.

As mentioned above, the wire connecting load Z and electronic fuse circuit F may be designed to withstand a nominal current of the load Z. The lifetime of a wire (or a cable) depends on the wire temperature. FIGS. 5A and 5B are diagrams showing a family of characteristic curves, wherein each characteristic curve is associated with a specific combination of maximum temperate difference dT (maximum temperature above ambient temperature) and cable cross section (e.g. cross-sectional area in $mm^2$). Each characteristic curve represents the relation between current and the maximum allowable time period that the wire can carry the current without exceeding the maximum temperature difference. FIG. 5A includes characteristic curves for various temperature differences dT and a specific cross sectional area of 0.35 $mm^2$, while FIG. 5B characteristic curves for a specific temperature differences dT of 25 K (Kelvin) and various cross sectional areas. As can be seen from FIGS. 5A and 5B, a wire with a cross-sectional area of 0.35 $mm^2$ may carry a current of approximately 9 A (amperes) for practically an infinite amount of time without exceeding a temperature difference dT of 25 K above ambient temperature. As can be seen from FIG. 5B, a wire with a cross-sectional area of 0.75 $mm^2$ may carry a current of 10 A (amperes) for approximately 100 seconds before exceeding a temperature difference dT of 25 K above ambient temperature. Generally, the higher the current, the shorter the allowable time period for a given cross-sectional area and a given temperature difference. It is noted that the characteristic curves shown in the diagrams of FIGS. 5A and 5B have a linearly falling branch in a double logarithmic representation.

As can be seen from FIGS. 5A and 5B, a temperature difference $dT_x$ (e.g. temperature values $dT_1$, $dT_2$, $dT_3$, $dT_4$, $dT_5$, $dT_6$) is associated with a given integration time $t_x$ (e.g. times $t_1$, $t_2$, $t_3$, $t_4$, $t_5$, $t_6$) for a given current (see FIG. 5A, current $i_x$) and a specific cross-sectional area (e.g. 0.35 $mm^2$ in the example of FIG. 5A). Hence, a temperature value dT (representing the temperature above ambient temperature) may be determined for a specific wire cross section by integrating the current $i_L = i_x$ passing through the wire over time, and the first protection signal OC may indicate a switch-off of the electronic switch 2 when the temperature value dT reaches a defined first reference temperature difference $dT_R$. The mentioned integration may be efficiently implemented using a digital filters, which may be included in the monitoring circuit 4 (see FIG. 2). One exemplary implementation of a monitoring circuit is illustrated in FIG. 6.

Figure 6:
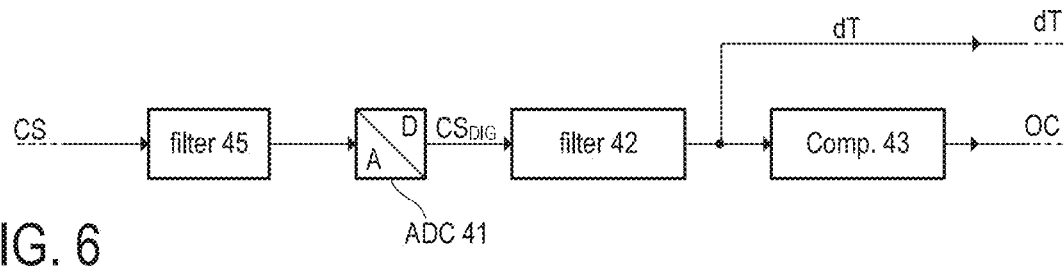
FIG. 6 illustrates one example of the monitoring circuit used in the example of FIG. 2

Basically, the monitoring circuit of FIG. 6 is configured to determine the first protection signal OC based on the current sense signal CS. As mentioned, the integration may be accomplished in digital filter 42 which has an integrating characteristic. According to the depicted example, the current sense signal CS, which may be a voltage that is proportional to the load current $i_L$, is supplied to the input of filter 45, which may be an (optional) analog low-pass filter to remove transients or the like that have a comparably high frequency, and/or to perform an anti-aliasing filter function. The output of filter 45 may be connected to the input of analog-to-digital converter (ADC) 41, which is configured to digitize the filtered current sense signal CS. The ADC 41 may have a logarithmic characteristic in order to account for the logarithmic characteristic curves shown in FIGS. 5A and 5B. The (e.g. logarithmized) digital current sense signal $CS_{DIG}$ is then converted to a temperature value dT by digital filter 42. The resulting temperature value dT (representing a temperature difference above ambient temperature) is then supplied to digital comparator 43, which may be configured to set the first protection signal OC to a high-level when the temperature value dT provided at the output of digital filter 42 exceeds the first reference temperature difference $dT_R$ (e.g. 25 K) specified for a specific wire cross-section. It is noted that, if the ADC 41 does not have a logarithmic characteristic, the digital current sense signal $CS_{DIG}$ should be squared before being supplied to the filter 42. In this regard, reference is made to FIG. 8 as well as to publication US20170294772A1, in which this concept of temperature calculation is described.

As mentioned, the digital filter 42 is configured to convert the load current $i_L$ (represented by the digitized current sense signal $CS_{DIG}$) and an associated integration time during which the current passes through the wire, into a temperature value. In the present example, the filter characteristic 42 depends on a parameter characterizing the wire, e.g. the cross-sectional area of the wire, which carries the load current and which may be represented by a family of characteristic curves such as those shown in the diagram of FIG. 5A (for an exemplary cross-sectional area of 0.35 mm²). In one specific example, the characteristic curves (or related curves) may be stored as a look-up table, i.e. by storing a plurality of sampling points of the characteristic curves in a memory. Values between two sampling points may be determined using, e.g. interpolation.

Conventional fuses are produced for a specific trigger current and with a specific trigger time (slow blow fuses, medium blow fuses, fast blow fuses), wherein the trigger time corresponds to a specific combination of reference temperature $dT_R$ and wire cross-section A as explained above (see FIGS. 5A and 5B). It would be desirable, however, to have a configurable fuse that may be used for various wire parameters such as, for example, wire cross-sections and reference temperature values $dT_R$ (maximum temperature above ambient temperature).

Figure 7:
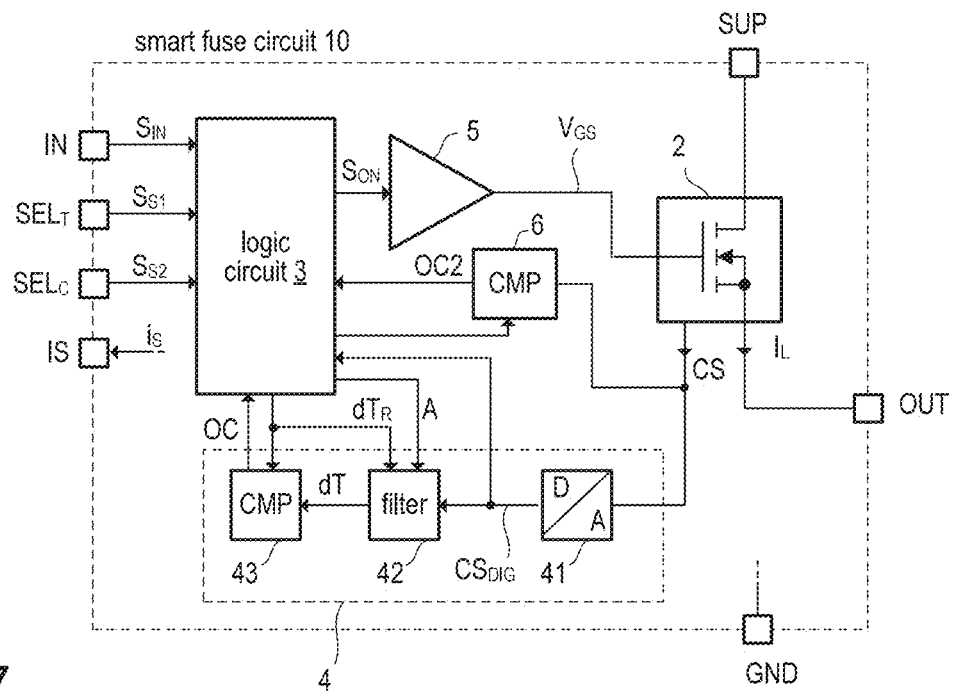
FIG. 7 illustrates a first example of an e-fuse ("smart fuse") circuit, which allows selection of wire cross section and maximum cable temperature.

FIG. 7 illustrates one example of an electronic fuse circuit, which is further referred to as smart fuse circuit 10. The circuit of FIG. 7 is substantially the same as the circuit of FIG. 2 and reference is made to the respective description. However, the logic circuit 3 is more sophisticated than in the example of FIG. 2 and the monitoring circuit 4 may be, for example, implemented in accordance with FIG. 6, wherein the analog low-pass filter 45 has been omitted (the low-pass filter 45 is optional). However, different from the example in FIG. 6, the monitoring circuit 4 is configurable in the present example so that its characteristic can be selected based on at least one wire parameter, which allows, for example, to select a characteristic curve (see FIGS. 5A and 5B) for a specific wire cross-section and/or a desired reference temperature difference $dT_R$. In the examples described herein, the at least one wire parameter is or represents the cable cross-sectional area and/or the maximum temperature value above ambient temperature or both. As can be seen in the diagrams of FIGS. 5A and 5B, these two wire parameters define a specific characteristic curve, which represents the desired behavior of the electronic fuse circuit for a specific wire/cable. It is understood that other parameters such as wire diameter or absolute temperature (e.g. in case ambient temperature is measured) may be used as wire parameters. Furthermore, a wire parameter is not necessarily proportional to any physical quantity (such as cross-sectional area or temperature) but can be a mere numerical parameter, which allows determining (e.g. selecting) a desired characteristic curve used by the monitoring circuit from a set of characteristic curves (see FIGS. 5A and 5B). As shown in FIG. 7, the electronic fuse circuit may be an integrated circuit arranged in one chip package, wherein the electronic switch 2 and the remaining circuit components (driver 5, logic circuit 3 and monitoring circuit 4) may be integrated in the same semiconductor die or in two separate semiconductor dies disposed in the chip package. However, in other embodiments the smart fuse circuit 10 may be distributed in two or more separate chip packages. In the example of FIG. 7 all the depicted circuit components are integrated in one semiconductor chip.

The load current path of the electronic switch 2 may be connected between a supply pin SUP and an output pin OUT of the smart fuse circuit 10. Generally, the logic circuit 3 may be configured to receive at least one wire parameter, which, in the present example, includes information about a wire cross-sectional area A and a reference temperature difference $dT_R$, from a microcontroller or other control circuitry. As illustrated in FIG. 6, the logic circuit 3 may be configured to receive signals from a controller via input pin IN (input signal $S_{IN}$, see also FIG. 2) and input pins $SEL_T$ and $SEL_C$ (selection signals $S_{S1}$ and $S_{S2}$ representing) and to provide a drive signal $S_{ON}$ for the electronic switch 2. In the present example, the selection signal $S_{S1}$ is indicative of a specific one of a set of specific curves and thus represents a wire parameter. The selection signal $S_{S2}$ is indicative of a specific trip current which represents a maximum current $i_{TRIP}$ (trip current) used to trigger an over-current shutdown (implemented, e.g. using comparator 6). The driver 5 may be configured to convert the signal $S_{ON}$, which is a binary logic signal, into a drive voltage $V_{GS}$ (gate-source voltage) or a respective drive current suitable to switch the electronic switch 2 on and off. Like in the example of FIG. 2, the monitoring circuit 4 receives an (analog) current sense signal CS and generates, based on this current sense signal CS, the first protection signal OC, which may be processed by the logic circuit 3, for example, as shown in the example of FIG. 3. It is noted that the term "pin" herein refers to any chip contact suitable to electrically and mechanically contact the integrated circuit to a carrier such as a printed circuit board.

Based on the information included in the at least one wire parameter and received, e.g., from the controller, the control logic 3 may configure the digital filter 42 and/or the comparator 43 so that the characteristic of the monitoring circuit 4 corresponds to a specific combination of wire cross-sectional area A and reference temperature difference $dT_R$. In the present example, the monitoring circuit 4 can be configured based on the selection signal $S_{S1}$ received at the input pin $SEL_T$. Thus, the selection signal $S_{S1}$ may represent a parameter which is indicative of a desired wire (cross section and temperature difference). The ground pin GND shown in FIG. 4 is coupled to a reference potential, e.g. ground potential, and connected to the logic circuit 3, and other circuit components that need a reference potential for proper operation. It is understood that, in another embodiment, the wire parameter(s) may also be coded into a single (e.g. digital) selection signal, e.g. received by a digital communication interface such as a Serial Peripheral Interface (SPI). Further, it is understood that the specific mechanism of how the information concerning is provided to the logic circuit is not relevant. Basically, the monitor circuit 4 is configured to be suitable for a specific wire.

The above-mentioned comparator 6 may be used to implement an additional protection mechanism, which initiates an immediate over-current shutdown in response to detecting a load current $i_L$ equal to or greater than the maximum current ($i_L \geq i_{TRIP}$), which can be configured based on the selection signal $S_{S2}$ received at the input pin $SEL_C$. Accordingly, the comparator 6 signals to the logic circuit 3 to trigger an immediate over-current shutdown in response to detecting $i_L \geq i_{TRIP}$ by setting the second protection signal OC2 to an appropriate logic level (e.g. a high level). It is noted that this additional protection mechanism is independent from the selected characteristic curve and is primarily intended to protect the electronic switch 2 as such and not to protect load and wire. In other embodiments, the information about this parameter (maximum current/trip current $i_{TRIP}$) can be provided to the logic circuit, e.g. via a serial communication interface such as the mentioned SPI.

Figure 8:
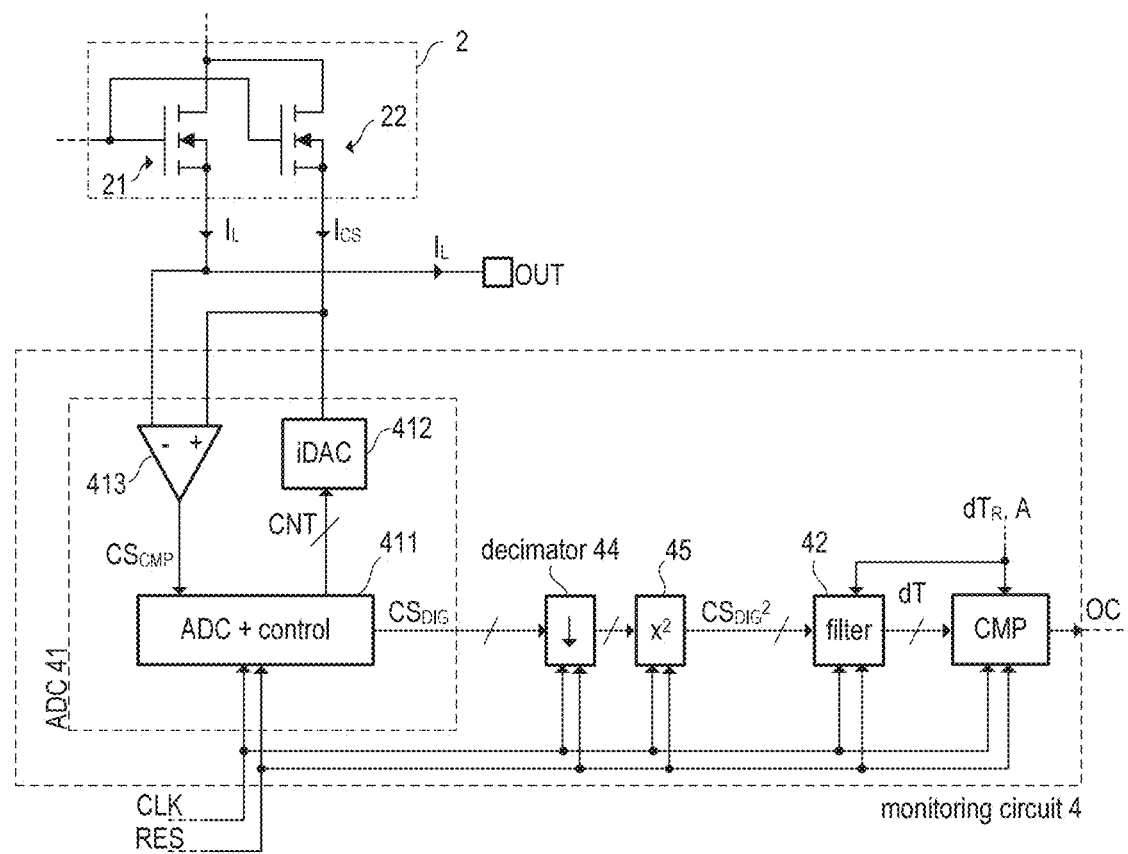
FIG. 8 illustrates one further example of the monitoring circuit used in the embodiment of FIG. 2.

FIG. 8 illustrates another exemplary embodiment of the monitoring circuit 4 in more detail. FIG. 8 also illustrates one example of how the current sensing may be implemented in more detail. For the purpose of current measurement, a so-called Sense-FET circuit is used. That is, the electronic switch actually includes two MOSFET transistors 21 and 22; transistor 21 is the actual load transistor that is coupled between a supply node (supply pin SUP) and output node (output pin OUT) and it carries the load current $i_L$, and transistor 22 is configured as sense transistor that provides a sense current $i_{CS}$ indicative of the load current. The gate electrodes of load transistors 21 and sense transistor 22 are connected and receive the same gate voltage. Similarly, the drain electrodes of load transistors 21 and sense transistor 22 are connected and receive the same drain voltage (supply voltage $V_B$ in the case of a high-side configuration). The source current of the sense transistor is referred to as sense current $i_{CS}$, which is substantially proportional to the load current $i_L$ (source current of load transistor 21) when the drain-source-voltages of both transistors 21, 22 are equal. In this case, the two transistors are operated in the same operating point and the ratio of the source currents $i_L/i_{CS}$ equals the ratio $A_{21}/A_{22}$ of the active areas of transistor 21 and transistor 22.

The monitor circuit 4 of FIG. 8 receives the current sense signal, which is the sense current $i_{CS}$ is the present example, and generates a respective digital current sense signal $CS_{DIG}$. The analog-to-digital converter (ADC) 41 may be a counter type ADC or a SAR (Successive Approximation Register) type ADC. Accordingly, the ADC 41 includes a control circuit 411, a current-output digital-to-analog converter (DAC) 412 and a comparator 413. The control circuit 411 is configured to modify a digital register CNT in accordance with a given scheme and the resulting analog current sunk from the source terminal of the sense transistor 22. That is, the output node of the current-output DAC is connected to the source electrode of the sense transistor 22 and, thus, the source current of the sense transistor is practically set by the DAC 412. The comparator 413 is configured to compare the source potentials of load transistor 21 and sense transistor 22 and indicates (by a level change at its output) when the source potentials are equal. As mentioned, in this situation the sense current $i_{CS}$ is proportional to the load current $i_L$ and thus the value of register CNT represents the load current and is output as digital current sense signal $CS_{DIG}$. In a simple implementation, the control circuit 411 may basically include a counter that is regularly reset and adds up (thereby ramping up the DAC output current) until the comparator 413 indicates that the source potentials of transistors 21, 22 are equal. As mentioned, more sophisticated schemes (such as SAR) may be used to modify the register CNT.

Dependent on the implementation the monitoring circuit 4 may include a decimator 44 (which is thus optional) to reduce the data rate or to perform an averaging function of the digital data stream provided by the ADC 41. The monitoring circuit 4 may further include the squaring unit 45 configured to calculate the square of the digital current sense signal $CS_{DIG}$. The squaring unit 45 is optional and can be omitted when the ADC 41 has a logarithmic characteristic as already mentioned above. In the example depicted in FIG. 8, the ADC 41 has a linear characteristic and the squared current sense signal $CS_{DIG}^2$ is filtered using a digital filter 42. The filter 42 may include an integrating characteristics as already discussed above and the filter output signal represents the cable temperature and indicates a temperature difference dT of the cable above ambient temperature. Digital comparator 43 is used to compare the temperature difference dT with a threshold and indicate an overcurrent (signal OC) when a reference temperature difference $dT_R$ is exceeded. It is noted that the digital circuitry included in monitor circuit 4 operates using a clock signal CLK and needs to be initialized to a specific initial state, which is usually done by a reset signal RES.

Figure 9:
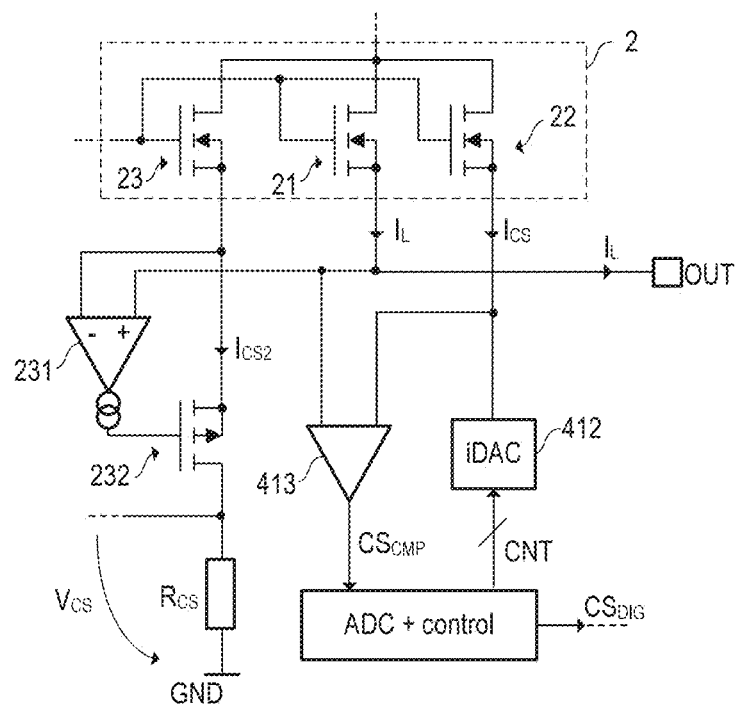
FIG. 9 illustrates a further example of a current sense circuit that may be used in connection with the monitoring circuit of FIG. 8.

FIG. 9 illustrates one further exemplary implementation of the current sense function. Basically, the current sense circuit shown in FIG. 9 is an enhancement of the current sense circuit included in FIG. 8, which has already been discussed further above. In the example of FIG. 9, a Sense-FET circuit is used, wherein the electronic switch 2 includes three MOSFET transistors 21, 22, and 23. Transistor 21 is the actual load transistor that is coupled between a supply node (supply pin SUP) and output node (output pin OUT) and it carries the load current $i_L$ (like in the example of FIG. 8); transistors 22 and 23 both are configured as sense transistors that provide a sense current $i_{CS}$ and, respectively, $i_{CS2}$ which are indicative of the load current. The gate electrodes of load transistors 21 and the sense transistors 22 and 23 are connected and receive the same gate voltage $V_G$. Similarly, the drain electrodes of load transistors 21 and the sense transistors 22 and 23 are connected and receive the same drain voltage (supply voltage $V_B$ in case of a high-side configuration). The source current of the sense transistor 22 is referred to as sense current $i_{CS}$, and the source current of the sense transistor 22 is referred to as sense current $i_{CS2}$, both of which are substantially proportional to the load current $i_L$ (source current of load transistor 21) when the drain-source-voltages of the transistors 21, 22, and 23 are equal.

The parts on the right side of FIG. 9 (current output DAC 412, control circuit 411, and comparator 413) are the same as in the example of FIG. 8 and reference is to the respective description above. The control circuit 411 can operate as analog-to digital converter and generates a digital current sense signal $CS_{DIG}$, which is used, for example, by for calculating the temperature difference dT in the monitoring circuit. The parts on the left side of FIG. 9 (further transistor 232, resistor $R_{CS}$ and amplifier 231) are configured to perform a redundant current measurement. In the present example, the transistor 232 is a p-channel MOS transistor whose source electrode is connected to the source electrode of sense transistor 23, so that the source current iCS2 of sense transistor 23 is also the source current of the further transistor 232. The first and second input of the amplifier 231 are connected to the source electrode of the load transistor 21 and the sense transistor 23, and the output of the amplifier 231 is connected to the gate electrode of the transistor 232. The amplifier 232 may be implemented as operational transconductance amplifier (OTA) which drives the transistor 232 such that the difference between the source potentials of the load transistor 21 and sense transistor 23 approaches zero. As mentioned, in such a situation, the sense current $i_{CS2}$ is proportional to the load current $i_L$ as the two transistors 21, 23 operate in the same operating point. The sense current $i_{CS2}$ passes the resistor $R_{CS}$ which is connected in series to the drain-source path of transistor 232. In the depicted example, the resistor $R_{CS}$ is connected between the drain electrode of transistor 232 and ground potential. The voltage drop $V_{CS}$ across the resistor $R_{CS}$ ($V_{CS}=R_{CS} \cdot i_{CS}2$) can be used as analog current sense signal and supplied to comparator 6 shown in FIG. 7. The comparator may be configured to compare the analog current sense signal $V_{CS}$ with a reference voltage $V_{REF}=R_{CS} \cdot i_{IDLE}/k_{ILIS}$. In this example $k_{ILIS}$ is the factor of proportionality between the load current $i_L$ and the sense current $i_{CS2}$ ($i_{CS2}=i_L/k_{ILIS}$).

It is noted that the analog current sense signal $V_{CS}$ may be supplied to the comparator 6 (see FIG. 7) that monitors the load current in order to trigger an over-current shutdown when the load current exceeds a specific maximum, whereas the digital current sense signal $CS_{DIG}$ may be processed in the monitoring circuit 4 in order to initiate a switch-off the electronic switch in accordance with a pre-selected characteristic curve for a specific wire.

Figure 10:
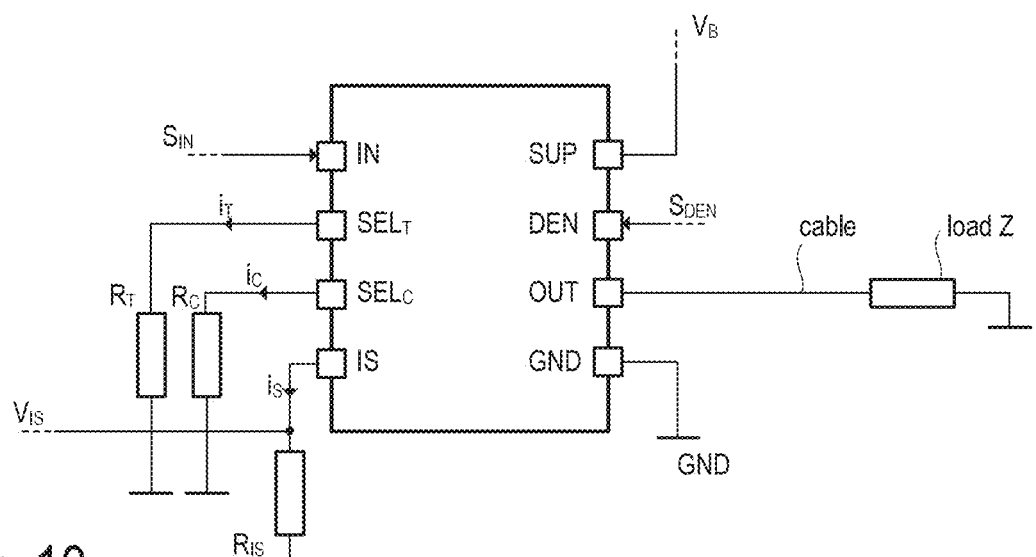
FIG. 10 illustrates one exemplary pin configuration of an integrated electronic fuse circuit with a dedicated input pin for receiving a diagnosis request signal and with one or more configuration pins.

FIG. 10 illustrates one exemplary embodiment of how an electronic fuse circuit 10 (smart fuse circuit) can be used to protect a load. In particular, FIG. 10 includes the circuitry which is externally connected to the electronic fuse circuit 10, which is, in the present example, integrated in a single chip. The supply pin SUP is connected to a voltage supply (e.g. a battery terminal providing supply voltage $V_B$) and the ground pin GND is connected to a ground terminal. The input signal $S_{IN}$ supplied to the input pin IN is a logic signal whose logic level (high level or low level) is indicative of whether to switch the electronic switch 2 on or off. The load (represented by impedance Z) is connected to the output pin OUT via a wire. The selection signals $S_{S1}$ and $S_{S2}$ mentioned above may be generated by connecting resistors $R_T$ and $R_C$ to the input pins $SEL_T$ and $SEL_C$, respectively. The electronic fuse circuit may include current sources providing defined constant currents $i_T$ and $i_C$ at the input pins at the input pins $SEL_T$ and $SEL_C$. These currents $i_T$ and $i_C$ are drained via the resistors $R_T$ and $R_C$ connected to the input pins $SEL_T$ and $SEL_C$ thereby causing respective voltage drops $i_T \cdot R_T$ and $i_C \cdot R_C$. These voltage drops form the mentioned selection signals $S_{S1}$ and $S_{S2}$ shown in the example of FIG. 7 and represent a desired wire characteristic (FIGS. 5A and 5B) to be selected and, respectively, a desired maximum current $i_{TRIP}$ to be used by the above-mentioned over-current shut-down function.

Figure 11:
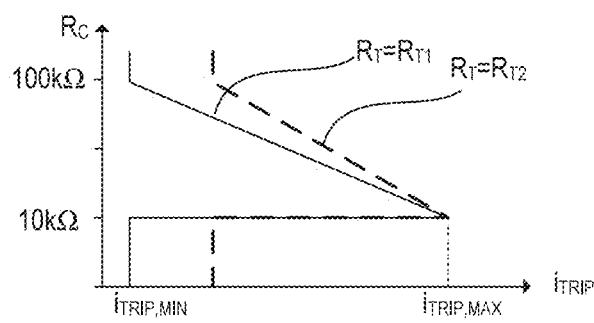
FIG. 11 illustrates one example of a relation between the resistance of a resistor connected to a configuration pin and a trip current used to trigger an over-current shutdown.

FIG. 11 illustrates one exemplary relation between the resistor $R_C$ connected to the input pin $SEL_C$ and the resulting maximum current $i_{TRIP}$ used in the over-current shutdown mechanism discussed above. To set a specific maximum current $i_{TRIP}$, the resistance of the resistor $R_C$ may be chosen between, for example, 10 kilo-ohms and 100 kilo-ohms. In the present example, the maximum current $i_{TRIP}$ no longer changes when the resistance is increased above 100 kilo-ohms, between 10 kilo-ohms and 100 kilo-ohms the current $i_{TRIP}$ is inverse proportional to the resistance, and—in order to avoid an overlarge trip current when the input pin $SEL_C$ is shorted to ground (which effectively means $R_C=0\Omega$)—the trip current $i_{TRIP}$ is set to the minimum trip current $i_{TRIP,MIN}$ when the resistance of resistor $R_C$ is lower than 10 kilo-ohms. It is noted that, in one specific embodiment, the minimum trip current $i_{TRIP,MIN}$ may depend on the selected characteristic curve (determined by resistor $R_T$ at pin $SEL_T$). Accordingly, the relation between resistance of resistor $R_T$ and trip current $i_{TRIP}$ that is actually used may depend on the selected characteristic curve (cf. FIGS. 5A and 5B).

Figure 12:
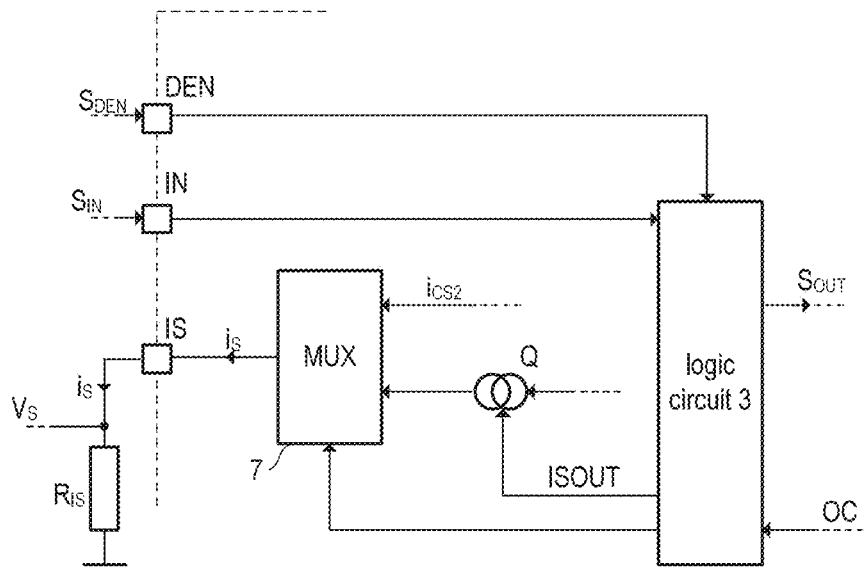
FIG. 12 illustrates one exemplary implementation of a current output circuit included in the electronic fuse circuit and configured to provide a diagnosis current.

Referring again to FIG. 10, the input pin DEN (Diagnosis ENable) and the current output pin IS are used to implement a diagnosis function, which is described below in more detail and with reference to FIGS. 12 and 13. FIG. 12 illustrates only those components of the electronic fuse circuit 10 which are needed further in the following discussions. The components omitted in FIG. 12 may be implemented in the same way as illustrated in the example of FIG. 7 and reference is made to the description above. As mentioned, the output pin IS is configured to output a current is, which may be converted to a respective voltage $V_S$ by draining the output current is via a resistor $R_S$, which is connected between the output pin IS and ground (or any other suitable constant potential). The electronic fuse circuit may include an analog multiplexer 7 which allows to selectively output either a current $i_{CS2}$ that is indicative of the load current (for example, the analog current sense signal provided by a sense transistor, see, e.g. FIG. 9) or an output current provided by the controllable current source Q whose output current may be digitally set by the logic circuit 3, e.g. by the digital control signal ISOUT. The particular implementation is not relevant for the further discussion. What is important is that the logic circuit 3 is capable of determining the output current is provided at output pin IS. The information that is transported by the output current is may depend on the input signal DEN (which is a logic signal) and further on the particular switching pattern of the signal DEN. Further, information may additionally depend on the logic level of the input signal $S_{IN}$ applied to input pin IN. Generally, the multiplexer 7 and the current source Q may be regarded as a current output circuit, wherein the output current level can be determined by the logic circuit 3.

The circuit design shown in FIG. 12 allows a readout of various settings of the logic circuit 3, particularly the readout of the selected characteristic curve (see FIGS. 5A and 5B) used by the monitoring circuit 4 as well as the readout of the trip current $i_{TRIP}$ currently used by the over-current shut-down function (see FIG. 7, comparator 6). Further, the current sense signal can be output at pin IS. Dependent on the actual implementation, the logic circuit 3 may be configured to output further information such as, for example, a measured temperature value.

Figure 13:
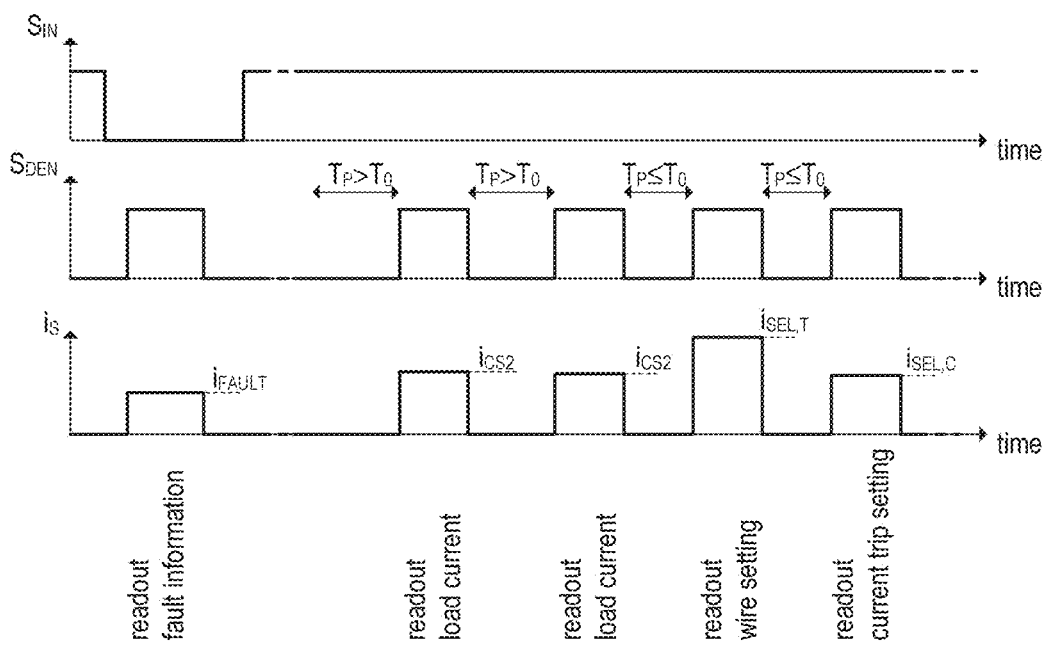
FIG. 13 includes timing diagrams showing exemplary wave forms of the diagnosis request signal and the resulting diagnosis current.

The timing diagrams in FIG. 13 illustrate one example of the mentioned diagnosis function that may be implemented (inter alia) in the logic circuit 3. When the input signal $S_{DEN}$ (diagnosis request signal, "Diagnosis ENable") is set, e.g., to a high level, a diagnosis current is is output at pin IS. The meaning of this diagnosis current is (i.e. the information conveyed by the diagnosis current is) depends on the logic level of input signal $S_{IN}$ and the timing of the high-level pulses of signal $S_{DEN}$. One example is illustrated in FIG. 13, in which exemplary timing diagrams of the input signals $S_{IN}$ and $S_{DEN}$ and the diagnosis current is are shown.

While the input signal $S_{IN}$ is at a low level, which indicates a switch-off of the electronic switch 2 (see FIG. 7), a high level of the diagnosis request signal $S_{DEN}$ causes a diagnosis current is, which is output at pin IS, wherein the level of the diagnosis current is indicative of a fault state $i_S = i_{FAULT}$. That is, the level of the current $i_{FAULT}$ indicates the cause of an error that might have led to a switch-off of the electronic fuse. Accordingly, an over-current shut-down can be distinguished from a switch-off triggered by an excessive junction temperature of the transistor forming the electronic switch, or from a switch off triggered by the monitoring circuit 4 (because the estimated wire temperature became too high). It is understood that the current $i_{FAULT}$ may also indicate that no error has been detected.

While the input signal $S_{IN}$ is at a high level, which indicates an a switch-on of the electronic switch 2 (normal operation), a high level of the diagnosis request signal $S_{DEN}$ causes a diagnosis current is, which is indicative of the load current $i_L$. That is, the multiplexer 7 (see FIG. 12) is controlled such that it outputs the analog current sense signal $i_{CS2}$ or the current provided by the controllable current source Q, wherein the current source is controlled such that its output current is indicative of the measured load current. As can be seen from FIG. 13, a high level of the diagnosis request signal $S_{DEN}$ causes the diagnosis current is indicative of the load current $i_L$ when a rising edge in the diagnosis request signal $S_{DEN}$ occurs after a the diagnosis request signal $S_{DEN}$ has been low for at least a given time period $T_0$ (pulse pause time)

Further information (in addition to the load current) can be read out if the diagnosis request signal $S_{DEN}$ includes two or more "on-pulses" with the pause(s) between the on-pulses being shorter than the time period $T_0$. In the example of FIG. 13, the fourth on-pulse in the diagnosis request signal $S_{DEN}$ (second timing diagram of FIG. 13) follows after the third on-pulse with a pause shorter than $T_0$ (pause time $T_P < T_0$) and, therefore, the diagnosis current is output at pin IS is set to be indicative of the selected wire characteristic (see FIGS. 5A and 5B). Similarly, the fifth (last) on-pulse in the diagnosis request signal $S_{DEN}$ is also asserted after a pause shorter than the given time period $T_0$ and, therefore, the diagnosis current is output at pin IS is set to be indicative of the currently used trip current $i_{TRIP}$ used to trigger an over-current shutdown (comparator 6, see FIG. 7).

Figure 14:
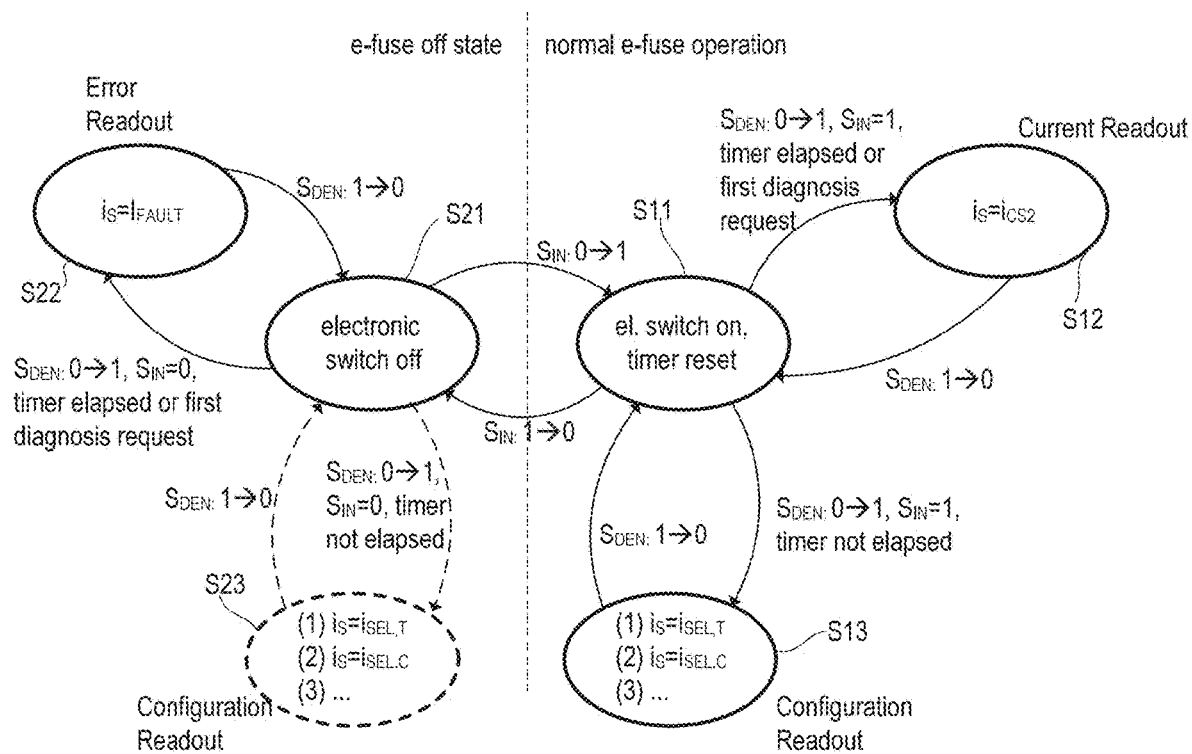
FIG. 14 is a state diagram representing the function of a finite state machine that controls the output of the diagnosis current.

Summarizing the above, the diagnosis current generally is controlled dependent on a pulse pattern of the diagnosis request signal $S_{DEN}$ so that the current output circuit sets the value of the diagnosis current is such that it represents one of the following: the load current (current sense signal $i_{CS}$, $i_{CS2}$, etc.), the selected characteristic curve (see FIGS. 5A and 5B), the trip current $i_{TRIP}$. The functionality described above can be implemented using a finite state machine (also referred to as finite automaton) and thus be described by a state diagram, an example of which is shown in FIG. 14. The state machine may be implemented, for example, in the logic circuit 3 (see FIG. 7).

In FIG. 14, the states S11, S12, and S13 represent the normal operation of the electronic fuse circuit (input signal $S_{IN}=1$), whereas the states S21, S22 and S23 only are relevant in an off state of the electronic switch (input signal $S_{IN}=0$). In state S11, the electronic switch 2 is on and connects supply node SUP with output node OUT (see FIG. 7). In state S11, a timer is reset when the state changes from S12 to S11 or S13 to S11. The timer elapses when the above-mentioned predetermined time period $T_0$ has elapsed since the reset. When—while in state S11—the diagnosis request signal $S_{DEN}$ is set to a high level (logic 1) at the first diagnosis request and/or when the timer has elapsed, then the state changes to S12, in which the diagnosis current is output at chip pin IS represents the load current $i_L$ passing through the electronic switch (current readout state). When the diagnosis request signal $S_{DEN}$ is set to a low level (logic 0) then the state changes back to S11.

Similarly, when—while in state S11—the diagnosis request signal $S_{DEN}$ is set to a high level and when the timer has not elapsed, then the state changes to S13, in which the diagnosis current is output at chip pin IS represents a configuration parameter of the electronic switch (configuration readout state). The specific configuration parameter which is output in the form of the diagnosis current is depends on how often State S13 has been entered (without entering S12 or S21 in the meantime). In the present example, the diagnoses current is equals current $i_{SEL,T}$, which is indicative of the currently selected wire characteristic, in response to the first change to state S13. The diagnosis current is equals current $i_{SEL,C}$, which is indicative of the currently selected trip current, in response to the second change to state S13. A further parameter may be read out by setting the diagnosis current to the appropriate value in response to the third change to state S13, and so on. In state S11, the timer may not be reset when changing back from state S13 to state S11 for the, e.g. third time. As a consequence, the following on pulse in the diagnosis request signal $S_{DEN}$ will again result in a change into the current readout state S12 regardless of the length of the pulse pause.

When—while in state S21—the diagnosis request signal $S_{DEN}$ is set to a high level (logic 1), then the state changes to S22, in which the diagnosis current is output at chip pin IS represents an error information. When the diagnosis request signal $S_{DEN}$ is set to a low level (logic 0) then the state changes back to S21. The states S21 and S11 are entered in accordance with the level of the input signal $S_{IN}$ received at input pin IN of the integrated electronic fuse circuit. State S23 is basically the same as state S13, and is regarded as an option (and thus drawn with dashed lines) which may or may not be implemented dependent on the actual product. The information which can be readout in state S23 may be difference from the information, which can be readout in state S13.

Figure 15:
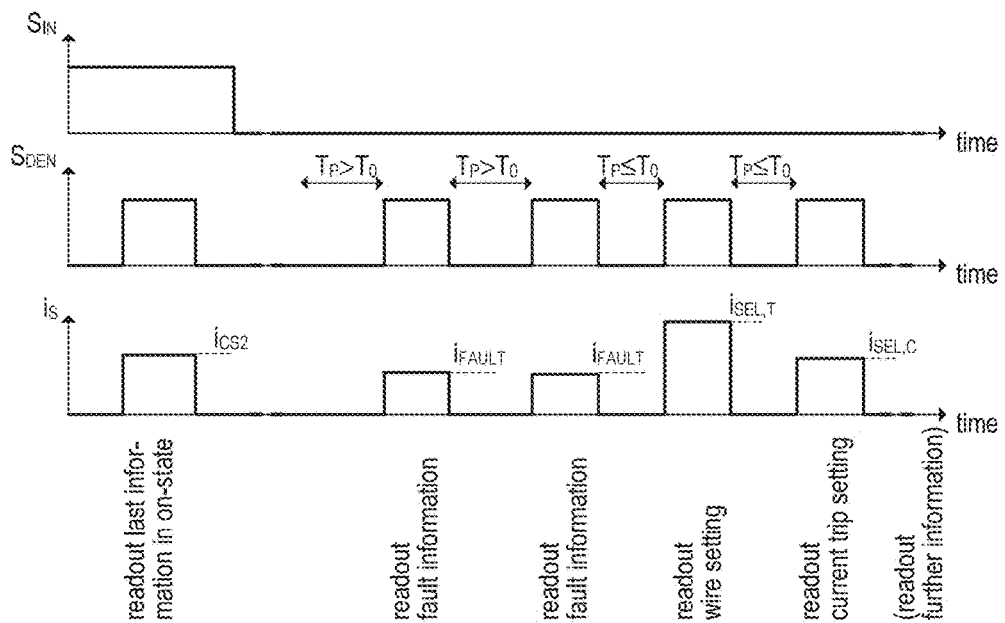
FIG. 15 includes timing diagrams showing a further example of wave forms of the diagnosis request signal and the resulting diagnosis current.

FIG. 15 includes timing diagram similar to FIG. 13. While the input signal $S_{IN}$ is at a high level (input signal $S_{IN}=1$), a diagnosis request ($S_{DEN}=1$) may trigger the diagnosis current is being indicative of the current sense signal ($i_S = i_{CS2}$) as explained above with reference to FIGS. 13 and 14 (see state S12, current readout). When the input signal $S_{IN}$ switches to a low level (input signal $S_{IN}=0$), a diagnosis request ($S_{DEN}=1$) may trigger a similar function, wherein the meaning of the diagnosis current is is different. The first diagnosis request results in the diagnosis current is being indicative of the fault state ($i_S = i_{FAULT}$). The effect of a subsequent diagnosis request depends on how much time has elapsed since the last high-to-low transition of the signal $S_{DEN}$. If the elapsed time is higher than $T_0$, then the diagnosis request will again result in the diagnosis current is being indicative of the fault state. If, however, the elapsed time is lower than or equal to $T_0$, then further information can be read out (see FIG. 14, transition to state S23). In the example of FIG. 15, the diagnosis current is can be set to $i_{SEL,T}$ or $i_{SEL,C}$ which are indicative of the currently selected wire characteristic and, respectively, the currently selected trip current. Further information may be provided in the same way dependent on the actual implementation of the product.

Figure 16:
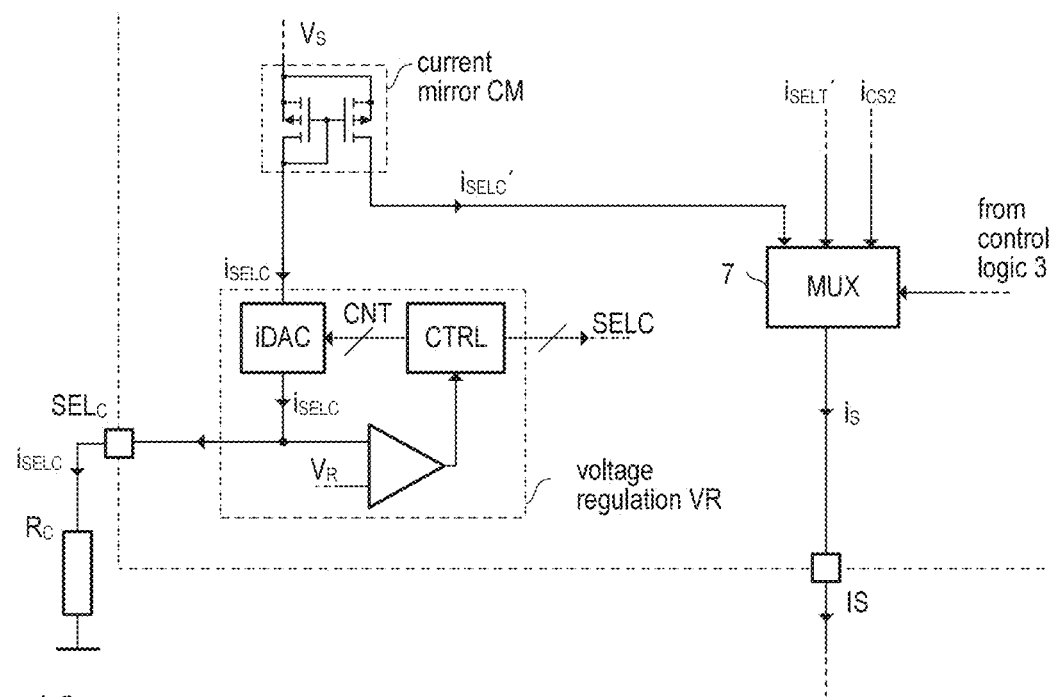
FIG. 16 illustrates a modification/enhancement of the circuit of FIG. 12.

The example of FIG. 16 relates to an modification/enhancement of the circuit of FIG. 12. The circuit illustrated in FIG. 16 is one option of how to generate a current $i_{SELC}'$ that is indicative of the resistance of the external resistor $R_C$ connected to the chip contact $SEL_C$. As discussed above with reference to FIGS. 10 and 11, the resistance of the external resistor $R_C$ determines the trip current $i_{TRIP}$ used for an over-current shutdown. The following description is to explain how this resistance value can be "converted" into a current $i_{SELC}'$ which represents the parameter $i_{TRIP}$, which can be used as a reference in an analog comparator (such as comparator 6 in FIG. 7 if implemented by analog circuitry), and which can also be output as diagnosis current is together with other parameters as illustrated in the bottom diagram of FIG. 13.

Accordingly, in the present example, the electronic fuse circuit includes a voltage regulation circuit VR, which is coupled to the chip contact $SEL_C$ and thus to the resistor $R_C$. The voltage regulation circuit VR is configured to adjust a current $i_{SELC}$, which is output at chip contact $SEL_C$ to the resistor $R_C$, such that the resulting voltage $R_C \cdot i_{SELC}$ at chip contact $SEL_C$ is approximately equal to a predefined reference voltage $V_R$ (e.g. $V_R$=0.5V). As shown in FIG. 16, the voltage regulator may include a current-steering DAC (labelled iDAC in FIG. 16) which is configured to provide current $i_{SELC}$ which is output at chip contact SELC and whose level is set in accordance with a digital word labelled CNT in the depicted example. The voltage regulation circuit VR further includes a control circuit CTRL that is configured to modify a digital register, in which the digital word CNT is stored, in accordance with a given scheme and thus the resulting current $i_{SELC}$. A comparator is configured to compare the voltage $R_C \cdot i_{SELC}$ at chip contact SELC with the mentioned reference voltage VR and signals to the control circuit CTRL when the voltage $R_C \cdot i_{SELC}$ has is equal to or falls below the reference voltage $V_R$. At the time the comparator signals that the voltage $R_C \cdot i_{SELC}$ is equal to or falls below the reference voltage $V_R$, the value CNT (which determines $i_{SELC}$) stored in the register is approximately proportional to resistance of resistor $R_C$ as the equation $i_{SELC}=V_R/R_C$ applies and output as digital value SELC. In a simple implementation, the control circuit CTRL may basically include a counter that is reset at e.g. at startup and adds up (thereby ramping up the DAC output current $i_{SELC}$) until the comparator indicates that the voltage $R_C \cdot i_{SELC}$ has reached the reference voltage $V_R$. More sophisticated schemes may be used to modify the register value CNT. Using a current mirror CM, the current output at chip contact $SEL_C$ can be "copied" and the mirror current $i_{SELC}'$ may be supplied to the analog multiplexer 7, which has already been discussed with reference to FIG. 12.

A similar voltage regulation circuit and current mirror can be used to provide a current $i_{SELT}$ that is output at chip contact $SEL_T$ (cf. FIG. 10) and "mirrored" to obtain a respective mirror current $i_{SELT}'$, which may also be supplied to the multiplexer 7. AS described with reference to FIGS. 12 and 13, the multiplexer may be controlled to select one of the currents input to the multiplexer 7. The selected input current is output at the diagnosis pin IS as diagnosis current is, e.g. in accordance with the scheme shown in FIG. 13.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. An integrated circuit comprising:
   a power transistor coupled between a supply pin and an output pin;
   a current sensing circuit configured to sense a load current passing through the power transistor and provide a respective current sense signal;
   a first configuration pin;
   a current output circuit configured to provide a diagnosis current at an current output pin;
   a diagnosis pin for receiving a diagnosis request signal; and
   control circuit configured to:
      select a characteristic curve representing a current versus time characteristic dependent on an external circuit connected to the first configuration pin;
      generate a drive signal for the power transistor dependent on the selected characteristic curve and the current sense signal; and
      control, dependent on a pulse pattern of the diagnosis request signal, the current output circuit to set a value of the diagnosis current such that it represents one of the following: the load current and the selected characteristic curve.

2. The integrated circuit of claim 1 further comprising:
   a second configuration pin,
   wherein the control circuit is further configured to:
      set a trip current used for an over-current shutdown dependent on an external circuit connected to the second configuration pin.

3. The integrated circuit of claim 2 further comprising:
   a comparator coupled to the current sensing circuit and configured to generate a shutdown-signal when a sensed current exceeds the trip current.

4. The integrated circuit of claim 2,
   wherein the trip current is set dependent on the external circuit connected to the second configuration pin and dependent on the selected characteristic curve.

5. The integrated circuit of claim 1,
   wherein, to control the current output circuit, the control circuit is configured to:
      evaluate the pulse pause proceeding a diagnosis request, which is signaled by an on-pulse of the diagnosis request signal.

6. The integrated circuit of claim 5,
wherein, to control the current output circuit, the control circuit is configured to:
control the current output circuit such that the diagnosis current is set to represent a specific parameter dependent on the pulse pause preceding a specific diagnosis request.

7. The integrated circuit of claim 5,
wherein, to control the current output circuit, the control circuit is configured to:
control the current output circuit such that the diagnosis current is set to represent a specific parameter dependent on the pulse pause preceding a specific diagnosis request and dependent on the number of diagnosis requests with the respectively preceding pulse pauses being lower than a predetermined pause time.

8. The integrated circuit of claim 1, further comprising:
an input pin for receiving an input signal;
wherein the control circuit is configured to switch the power transistor on or off in accordance with a logic level of the input signal.

9. The integrated circuit of claim 1, further comprising:
a monitoring circuit that is configured to provide a temperature value, which is indicative of a temperature of a wire connected to the output pin and which is estimated based on the sensed load current and the selected current versus time characteristic,
wherein the monitoring circuit is further configured to provide a protection signal indicative of whether the estimated temperature value is above a predetermined temperature threshold value, and
wherein the control circuit is configured to cause a switch-off of the power transistor in response to the protection signal indicating that the estimated temperature value is above a predetermined temperature threshold value.

10. A method comprising:
sensing a load current passing through a power transistor coupled between a supply pin and an output pin of an integrated circuit and providing a respective current sense signal;
selecting a characteristic curve representing a current versus time characteristic dependent on a external circuit connected to a first configuration pin;
generating a drive signal for the MOS-transistor dependent on the selected characteristic curve and the current sense signal;
receiving a diagnosis request signal at a diagnosis pin of the integrated circuit;
providing a diagnosis current at a current output pin of the integrated circuit, wherein the diagnosis current is set, dependent on a pulse pattern of the diagnosis request signal, such that it represents one of the following: the load current and the selected characteristic curve.

* * * * *